US012640746B2

(12) United States Patent
Zhu et al.

(10) Patent No.:  US 12,640,746 B2
(45) Date of Patent:       May 26, 2026

(54) ERROR POLARITY DETECTION FOR TIMING SKEW CALIBRATION

(71) Applicant: Analog Devices, Inc., Wilmington, MA (US)

(72) Inventors: Haiyang Zhu, Winchester, MA (US); Enrique Alvarez-Fontecilla, Encinitas, CA (US); Siddharth Devarajan, Arlington, MA (US)

(73) Assignee: Analog Devices, Inc., Wilmington, MA (US)

( * ) Notice: Subject to any disclaimer, the term of this patent is extended or adjusted under 35 U.S.C. 154(b) by 81 days.

(21) Appl. No.: 18/643,970

(22) Filed: Apr. 23, 2024

(65) Prior Publication Data

US 2025/0330188 A1     Oct. 23, 2025

(51) Int. Cl.
*H03M 1/00*          (2006.01)
*H03M 1/10*          (2006.01)

(52) U.S. Cl.
CPC ....... H03M 1/1014 (2013.01); H03M 1/1071 (2013.01)

(58) Field of Classification Search
CPC ............. H03M 1/1215; H03M 1/0673; H03M 1/0624; H03M 1/0836; H03M 1/121; H03M 1/1023; H03M 1/1028; H03M 1/12; H03M 1/1009; H03M 1/1004; H03M 1/1033; H03M 1/1038; H03M 1/662; H03M 1/0607; H03M 1/0634; H03M 1/124; H03M 1/00; H03M 1/0604;

H03M 1/0609; H03M 1/0626; H03M 1/0641; H03M 1/0678; H03M 1/0854; H03M 1/1019; H03M 1/1245; H03M 1/125; H03M 1/201;
(Continued)

(56) References Cited

U.S. PATENT DOCUMENTS 7,312,734 B2 * 12/2007 McNeill .............. H03M 1/1004
                                                                  341/120
7,916,050 B1 * 3/2011 Mujica .................. H03M 1/004
                                                                  455/108
(Continued)

FOREIGN PATENT DOCUMENTS

CN          120834812 A     10/2025

OTHER PUBLICATIONS

"European Application Serial No. 25171573.6, Extended European Search Report mailed Sep. 15, 2025", 10 pgs.
(Continued)

*Primary Examiner* — Linh V Nguyen
(74) *Attorney, Agent, or Firm* — Schwegman Lundberg & Woessner, P.A.

(57)          ABSTRACT
An electronic circuit comprises multiple analog-to-digital converters (ADCs), clock circuitry, and calibration circuitry. The clock circuitry is configured to provide clock signals to the multiple ADCs to advance the multiple ADCs through time-interleaved analog-to-digital (A/D) conversions. The calibration circuitry is configured to determine a magnitude of timing skew error between any two of the clock signals; apply a dither sequence to a first clock signal of the any two clock signals, wherein the first clock signal is applied to a first ADC; determine a polarity of the timing skew error by determining a polarity of gain experienced by the dither sequence from the time-interleaved A/D conversions.

20 Claims, 6 Drawing Sheets

(58) Field of Classification Search

CPC ...... H03M 1/468; H03M 1/06; H03M 1/0602; H03M 1/0621; H03M 1/0643; H03M 1/0646; H03M 1/066; H03M 1/0663; H03M 1/0827; H03M 1/1014; H03M 1/1042; H03M 1/1052; H03M 1/1061; H03M 1/1071; H03M 1/109; H03M 1/1205; H03M 1/1225; H03M 1/128; H03M 1/181; H03M 1/20; H03M 1/46; H03M 1/462; H03M 1/48; H03M 1/66; H03M 3/382; H03M 3/498

USPC .......................... 341/141, 155, 159, 118, 120

See application file for complete search history.

(56) References Cited

U.S. PATENT DOCUMENTS

| | | | | |
|---|---|---|---|---|
| 9,000,962 | B1 * | 4/2015 | Leuciuc .............. | H03M 1/0836 |
| | | | | 341/120 |
| 9,294,112 | B1 * | 3/2016 | Devarajan ........... | H03M 1/0836 |
| 9,385,745 | B1 * | 7/2016 | Op 'T Eynde .......... | H03F 3/505 |
| 10,218,372 | B1 * | 2/2019 | Farley ................. | H03M 1/0836 |
| 12,224,759 | B2 * | 2/2025 | Lee ..................... | H03M 1/1042 |
| 2001/0052864 | A1 * | 12/2001 | Shimizu .............. | H03M 1/0673 |
| | | | | 341/155 |
| 2008/0030387 | A1 * | 2/2008 | Sheng ................. | H04N 21/4263 |
| | | | | 341/120 |
| 2014/0232575 | A1 * | 8/2014 | Le Dortz ........... | H03M 1/0624 |
| | | | | 341/118 |
| 2017/0117914 | A1 * | 4/2017 | Choi ................... | H03M 1/1033 |
| 2018/0026781 | A1 * | 1/2018 | Otte .......................... | H04L 7/02 |
| | | | | 375/355 |
| 2021/0288656 | A1 * | 9/2021 | Ganesan ................. | H04B 1/12 |
| 2021/0359694 | A1 * | 11/2021 | Chen ................... | H03M 1/0624 |

OTHER PUBLICATIONS

Razavi, Behzad, et al., "Design Considerations for Interleaved ADCs", IEEE Journal of Solid-State Circuits, IEEE, USA, vol. 48, No. 8, (Aug. 1, 2013), 12 pgs.

Xu, Benwei, et al., "A 23-mW 24-GS/s 6-bit Voltage-Time Hybrid Time-Interleaved ADC in 28-nm CMOS", IEEE Journal of Solid-State Circuits, IEEE, USA, vol. 52, No. 4, (Apr. 1, 2017), 10 pgs.

\* cited by examiner

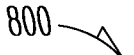

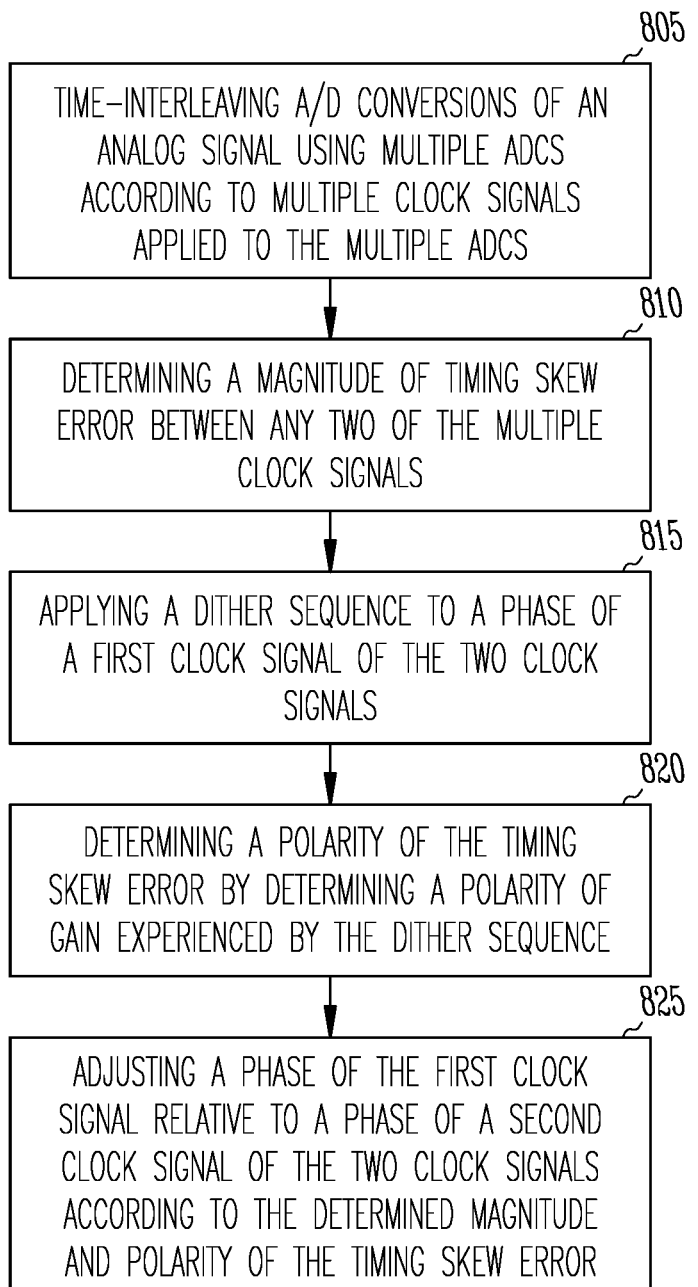

805

TIME-INTERLEAVING A/D CONVERSIONS OF AN ANALOG SIGNAL USING MULTIPLE ADCS ACCORDING TO MULTIPLE CLOCK SIGNALS APPLIED TO THE MULTIPLE ADCS

810

DETERMINING A MAGNITUDE OF TIMING SKEW ERROR BETWEEN ANY TWO OF THE MULTIPLE CLOCK SIGNALS

815

APPLYING A DITHER SEQUENCE TO A PHASE OF A FIRST CLOCK SIGNAL OF THE TWO CLOCK SIGNALS

820

DETERMINING A POLARITY OF THE TIMING SKEW ERROR BY DETERMINING A POLARITY OF GAIN EXPERIENCED BY THE DITHER SEQUENCE

825

ADJUSTING A PHASE OF THE FIRST CLOCK SIGNAL RELATIVE TO A PHASE OF A SECOND CLOCK SIGNAL OF THE TWO CLOCK SIGNALS ACCORDING TO THE DETERMINED MAGNITUDE AND POLARITY OF THE TIMING SKEW ERROR

*Fig. 8*

ERROR POLARITY DETECTION FOR TIMING SKEW CALIBRATION

BACKGROUND

Electronic systems can include analog-to-digital (A/D) converters (ADCs). ADCs are circuits that convert analog signals to digital quantities to allow processors of electronic systems to perform signal processing functions for the systems. To increase the speed of A/D conversions, ADCs can be time-interleaved. When multiple ADCs are time-interleaved, each ADC samples the analog input signal at a certain rate, and the outputs of all ADCs are combined to produce a digital output sequence whose rate corresponds to that of an individual ADC times the number of ADCs being time-interleaved. Accordingly, time-interleaved ADCs produce A/D conversions at a higher rate than individual ADCs operating in isolation. However, mismatches between the ADCs that make up a time-interleaved ADC create challenges to these systems.

OVERVIEW

This document relates generally to analog-to-digital converter (ADC) circuits, and in particular to improvements in the operation of time-interleaved ADCs. An example electronic circuit includes multiple ADCs, clock circuitry, and calibration circuitry. The clock circuitry is configured to provide clock signals to the multiple ADCs to advance the multiple ADCs through time-interleaved analog-to-digital (A/D) conversions. The calibration circuitry is configured to determine a magnitude of timing skew error between any two of the clock signals, apply a dither sequence to a first clock signal of the any two clock signals, wherein the first clock signal is applied to a first ADC of the multiple ADCs, and determine a polarity of the timing skew error by determining a polarity of gain experienced by the dither sequence from the time-interleaved A/D conversions.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 8 is a flow diagram of an example of a method to determine and correct timing skew in two-way time-interleaved A/D conversion.

DETAILED DESCRIPTION

The rate of analog-to-digital (A/D) conversions can be increased by time-interleaving the conversions of multiple A/D converters (ADCs). For example, a first ADC circuit can be performing a conversion while a second ADC circuit is sampling the input. This eliminates the sampling time from the time for conversion. More than two ADCs can be time-interleaved with the phases of each of the multiple ADCs staggered with the phases of the other ADCs to create a conversion "pipeline" in which a conversion result is produced faster than the conversion rate of any one ADC. However, there can be challenges in time-interleaved A/D conversions that limit accuracy of the overall output of the system.

Figure 1:
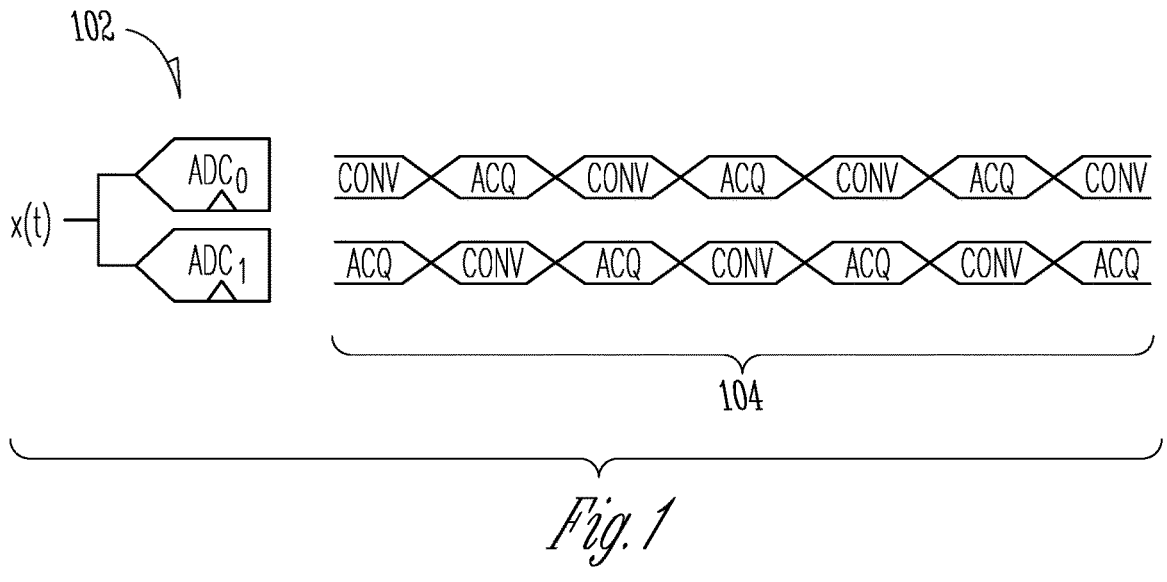
FIG. 1 is a diagram of an example of two-way time-interleaved A/D conversion.

FIG. 1 is a diagram of an example two-way time-interleaved A/D conversion. ADCs 102 sample and convert one analog input signal x(t) into digital quantities. The ADCs 102 are time-interleaved and operate as phase shifted parallel A/D converters to provide a times-two decrease in the time needed to complete an A/D conversion. More ADCs 102 can be interleaved (e.g., 4, 5, 8, 12, 16, etc.) to further increase the overall A/D conversion rate.

FIG. 1 also illustrates the interleaving of the acquisition and conversion operating states of the ADCs 102. In the example, the sampling clocks of the two ADCs 102 are 180° out of phase (360°/N, where N=2. For N=4, the sampling clocks of the four ADCs would be 90° out of phase). A disadvantage to the time-interleaving is that the overall output sequence of the time-interleaved ADCs can introduce interleaving conversion artifacts due to mismatches between the ADCs. These artifacts can lead to errors in the A/D conversion. One source of errors is a timing mismatch between the sampling times of the time-interleaved ADCs. One cause of a timing mismatch is accuracy of the clock phases that are input to the ADCs.

Figure 2:
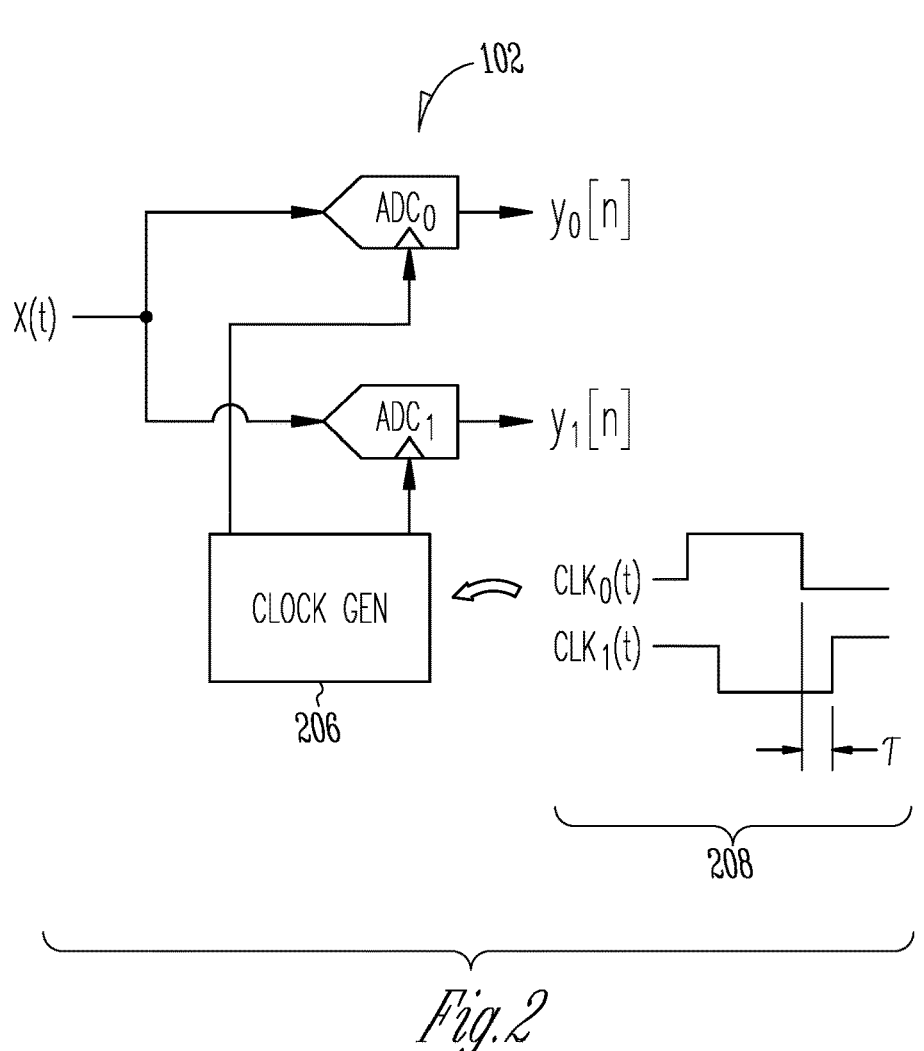
FIG. 2 is a circuit diagram of an example two-way time-interleaved ADC.

FIG. 2 is a circuit diagram of an example of two time-interleaved ADCs 102 and the clock circuitry 206 that generates the clock signals ($clk_0(t)$ and $clk_1(t)$) used by each of the ADCs 102 respectively to sample the analog input signal x(t). The ADCs 102 can be referred to as sub-ADCs or ADC "slices." In the example, the digital output sequences of the sub-ADCs are labeled $y_0[n]$ and $y_1[n]$. FIG. 2 also shows example waveforms 208 of the clock signals and a timing skew error (τ) between their phases as shown. Without timing skew error, the transitions of the clock signals are aligned.

Figure 3:
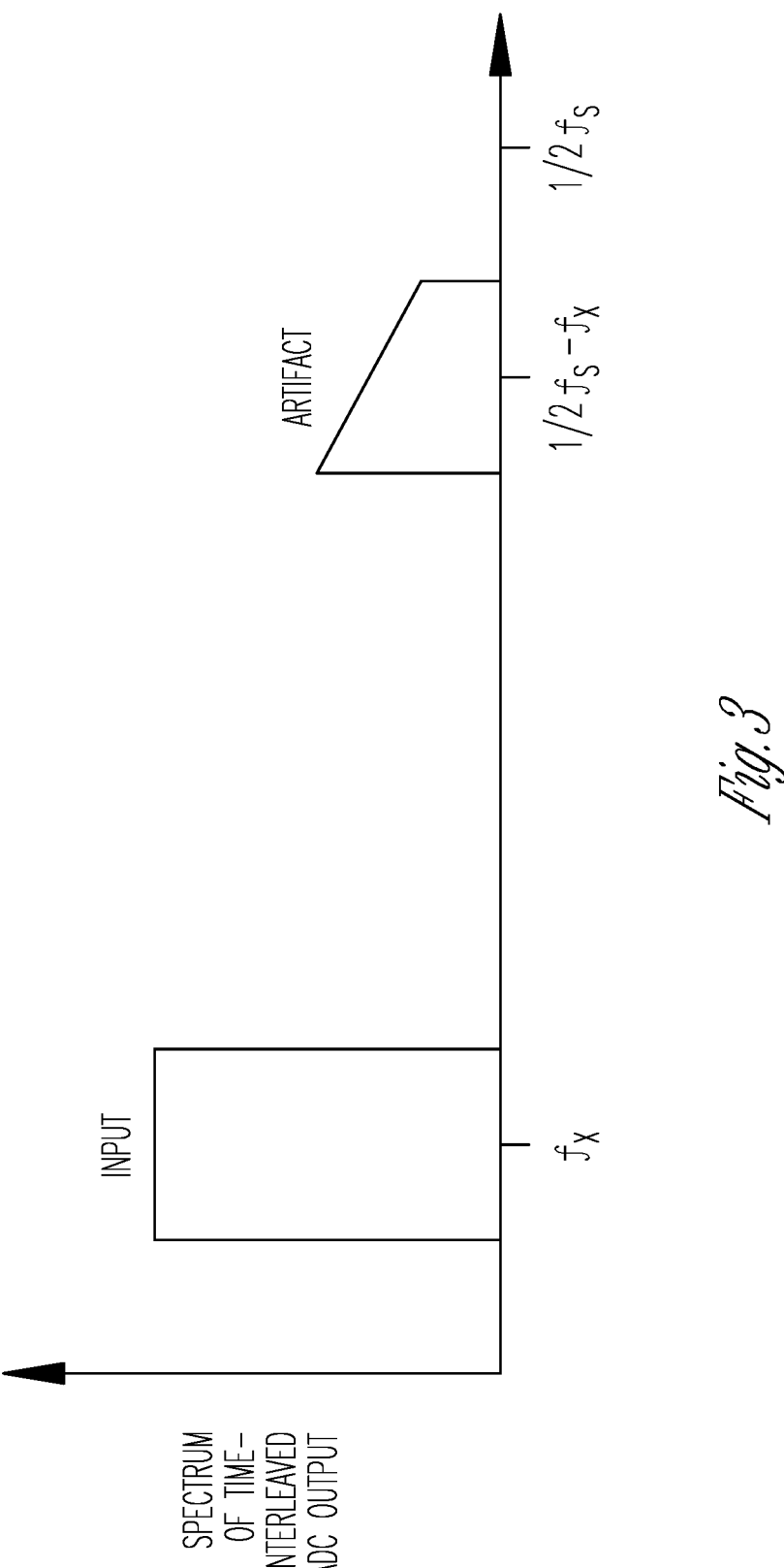
FIG. 3 is a graph showing an A/D conversion of an input signal in the frequency domain.

FIG. 3 is a graph that shows the desired A/D conversion of the analog input signal in the frequency domain and an artifact of the conversion due to clock timing skew. The desired conversion of the analog input signal is centered at the frequency of the input signal $f_x$ and the artifact occurs at ($\frac{1}{2}fs-fx$), where $f_s$ is the sampling frequency of the time-interleaved ADC (i.e., the sampling rate of each sub-ADC is given by $\frac{1}{2}f_s$).

Figure 4:
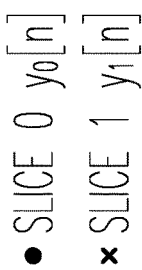
FIG. 4 is a graph showing timing of an A/D conversion of an input signal without timing skew error.
Figure 4:
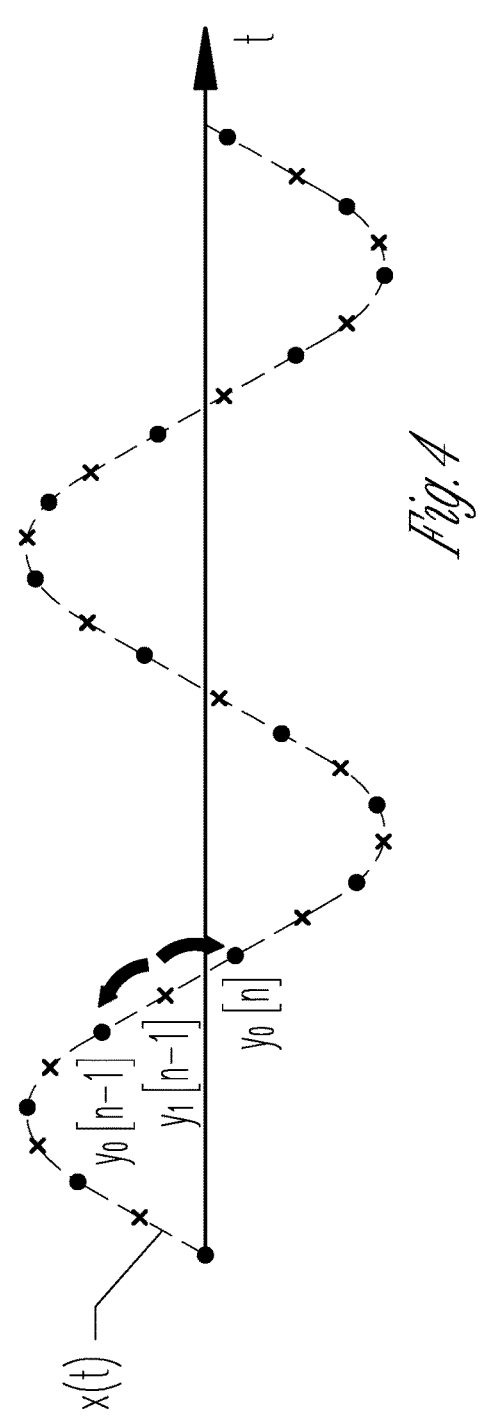
Figure 5:
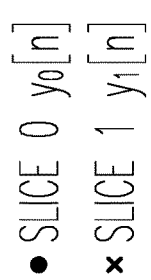
FIG. 5 is a graph showing timing of an A/D conversion of an input signal with timing skew error.
Figure 5:
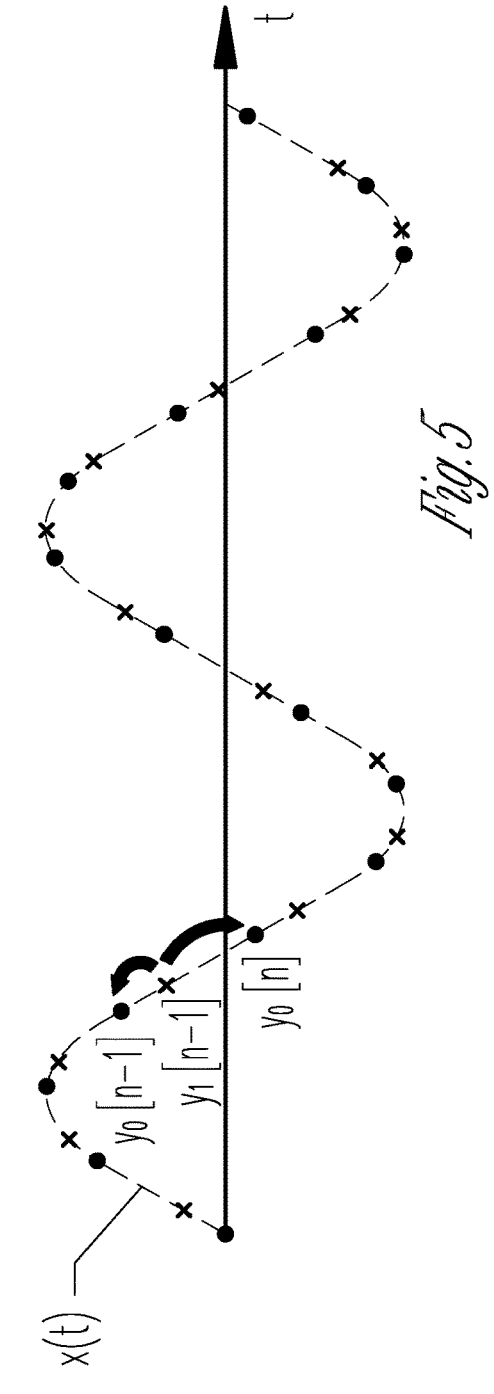

FIG. 4 is a time-domain plot that illustrates the output samples of a two-way time interleaved ADC being obtained from the analog input signal x(t) when there is no timing skew error. The conversion values from the two slices of the interleaved A/D conversion are labeled Slice 0 (from $ADC_0$) and Slice 1 (from $ADC_1$). In the plot, the arrows show that the output of the slices from the two ADCs are evenly spaced apart in time. FIG. 5 is a time-domain plot almost identical to the plot of FIG. 4, except the plot of FIG. 5 accounts for the effect of timing skew error. The arrows show that the slices from the two ADCs are not evenly spaced apart. In the plot of FIG. 5, the Slice 0 conversions to the left of the Slice 1 conversions are closer to the Slice 1 conversions than the Slice 0 conversions to the right of the Slice 1 conversions. In FIGS. 4 and 5, three adjacent conversions are labeled $y_0[n]$, $y_1[n-1]$, and $y_0[n-1]$, where the subscript indicates to which slice each conversion corresponds. In FIG. 4, the adjacent pairs of conversions are evenly spaced in time when there is not timing skew error. Thus, $y_1[n-1]$ is as similar to $y_0[n]$ as to $y_0[n-1]$ on average for some input signals. In FIG. 5, the adjacent pairs of conversions are not evenly spaced in time due to the timing skew error. The result is that $y_1[n-1]$ is more similar to $y_0[n-1]$ than to $y_0[n]$ on average for some input signals.

Figure 6:
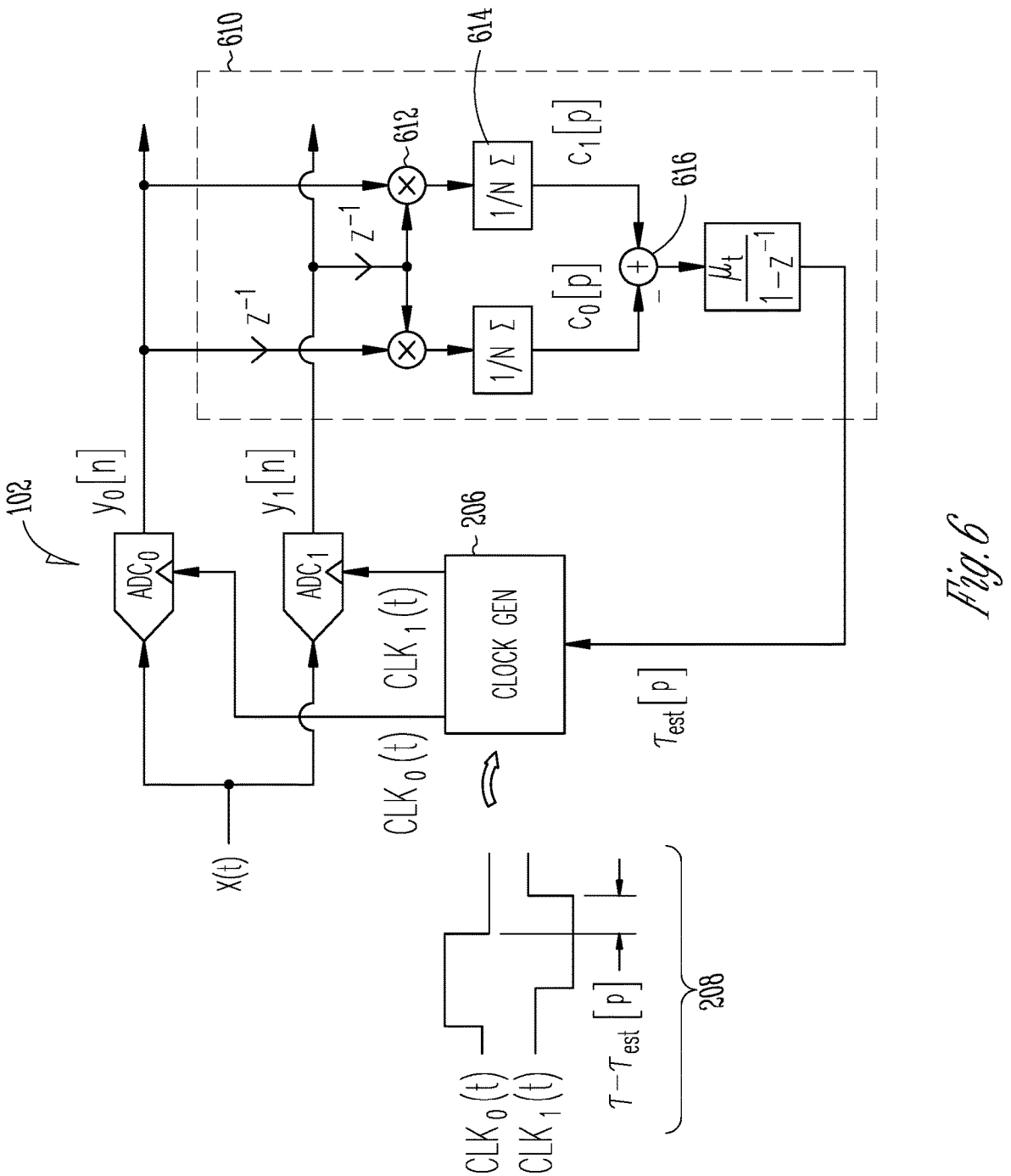
FIG. 6 is a circuit diagram of an example two-way time-interleaved ADC and calibration circuitry.

FIG. 6 is a system diagram showing an example two-way time-interleaved A/D conversion and calibration circuitry 610 to calibrate the clock circuitry 206 to reduce timing skew error in the clock signals provided to the sub-ADCs 102. To reduce the clock skew, the calibration circuitry 610 determines the similarity between adjacent conversions by the sub-ADCs 102, and the calibration circuitry 610 adjusts the relative timing of the clock signals so that on average pairs of adjacent conversion are equally similar (e.g., so that $y_0[n-1]$ and $y_1[n-1]$ are as equally similar as $y_0[n]$ and $y_1[n-1]$).

In some examples, the calibration circuitry 610 determines a first measure of similarity of an A/D conversion by $ADC_1$ to the A/D conversion by $ADC_0$ immediately preceding the A/D conversion by $ADC_1$, and determines a second measure of similarity between the A/D conversion by $ADC_1$ and the A/D conversion by $ADC_0$ following the A/D conversion by $ADC_1$. Different approaches can be used to determine similarity of A/D conversions, and the circuit diagram of FIG. 6 is only one example.

In the system diagram of FIG. 6, the first measure of similarity is $c_0[p]$ and the second measure of similarity is $c_1[p]$. The calibration circuitry 610 includes digital delays (shown as $z^{-1}$), multipliers 612, block average accumulators 614 (for which the output is divided by the number of accumulated samples N and the accumulators are reset after each accumulation), difference node 616, and an accumulator 618 with forward gain $\mu_r$. The calibration circuitry 610 may also include a microcontroller, a processor (e.g., a microprocessor), an application specific integrated circuit (ASIC), programmable gate array (PGA), etc. One or more of the delays $z^{-1}$, multipliers 612, block average accumulators 614, difference node 616, and accumulator 618 may be implemented by the microcontroller.

The multipliers 612 form products of the A/D conversions including $y_0[n-1]y_1[n-1]$ and $y_0[n]y_1[n-1]$. Multiple products of N A/D conversions (e.g., N=1000) are summed and averaged by the block average accumulators 614. After N samples are averaged, the block average accumulators 614 are reset. The averaged products are the measures of similarity $c_0[p]$ and $c_1[p]$. The difference between the measures of similarity is produced by the difference node 616. The accumulator 618 uses the difference in similarity measures to produce an estimate of the timing skew error $\tau_{est}[p]$, and the calibration circuitry 610 adjusts clock signal $clk_1(t)$ to reduce the effective timing skew error based on $\tau_{est}[p]$. The waveforms 208 of the clock signals show the positive transition of $clk_1(t)$ lagging the negative transition of $clk_0(t)$, but the skew may also cause the positive transition of $clk_1(t)$ to lead the negative transition of $clk_0(t)$. The polarity of $\tau_{est}[p]$ determines whether the calibration circuitry 610 changes the clock signal to advance or delay the phase transition of $clk_1(t)$ to reduce the timing skew error.

The approach shown in FIG. 6 works when the frequencies of the input signal x(t) are within a known Nyquist zone of the time-interleaved ADC. In the example of FIG. 6, if the sub-ADCs are each 5 Giga-samples per second (5 GSPS) ADCs, time-interleaving the A/D conversion increases the first Nyquist zone from 2.5 Hz to 5 Hz. However, there may be implementations where the sub-ADCs receive input signals with frequencies above the first Nyquist zone of the time-interleaved ADC. In this situation, the difference in similarity measures may correspond to a noisy measure of the timing skew error times minus one, which would cause the estimated timing skew error $\tau_{est}[p]$ determined by the calibration circuitry 610 to deviate from its ideal value, and hence degrade performance. A/D conversions of signals that either fall in unknown Nyquist zones or fall in multiple Nyquist zones may incorrectly flip the polarity of the error measurements.

Figure 7:
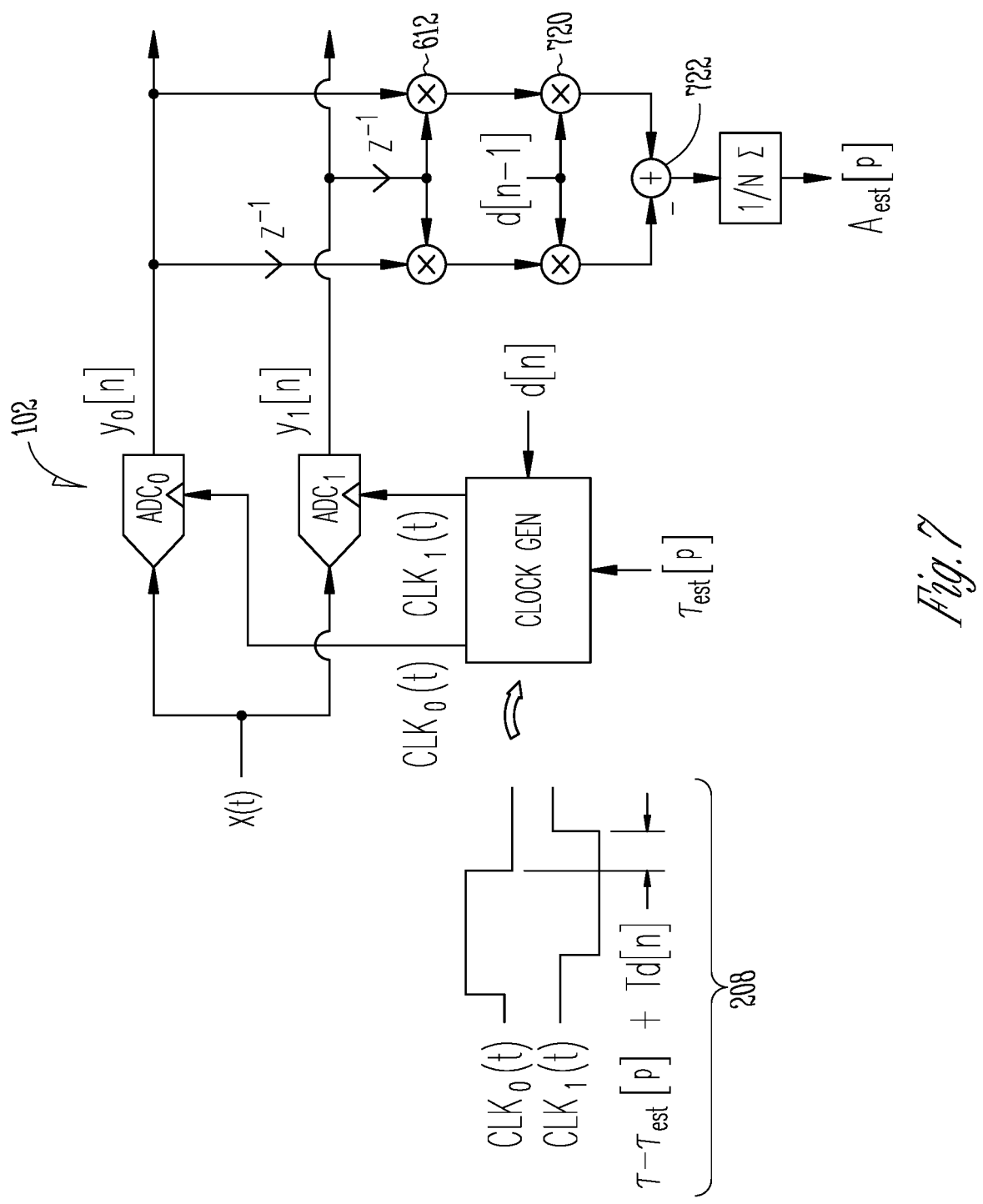
FIG. 7 is a circuit diagram of an example time-interleaved ADC and timing skew polarity detection circuitry.

FIG. 7 is a system diagram of another example of two-way time-interleaved A/D conversion that injects dither into the phase of one of the clock signals. To reliably determine the polarity of the estimated timing skew error, in the example of FIG. 7 a known pseudorandom dither sequence d[n] is injected into the phase of the $clk_1\tau(t)$ clock signal. The dither sequence d[n] may be a two-level zero-mean sequence that takes on values −1 and +1 with equal probability. Other dither sequences with other characteristics may also be used. With the injected dither sequence, the timing skew error is given by $\tau-\tau_{est}[p]+Td[n]$, where T is the gain (e.g., in femtoseconds) experienced by the dither sequence d[n] when injected into the phase of the clock signal $clk_1(t)$. From the viewpoint of the output of the time-interleaved ADCs 102, the sequence Td[n] experiences the same gain A as the residual timing skew error $\tau-\tau_{est}[p]$ that needs to be measured. Therefore, the polarity of the timing skew error measurement can be extracted from the polarity of the gain experienced by the dither sequence by the time-interleaved A/D conversion.

One approach to extracting the polarity of the gain experienced by the sequence Td[n] is to correlate the products of the multipliers 612 $y_0[n-1]y_1[n-1]$ and $y_0[n]y_1[n-1]$ with the dither sequence d[n]. The calibration circuitry of FIG. 7 includes multipliers 720 that produce the products $d[n-1]y_0[n-1]y_1[n-1]$ and $d[n-1]y_0[n]y_1[n-1]$, and includes a block average accumulator 724 to accumulate and average the difference of the products produced by difference node 722. The extracted gain $A_{est}[p]$ is an estimate of gain A, which can be filtered to mitigate measurement noise. The extracted $A_{est}[p]$ can be used to determine the polarity of the timing skew error measurement performed by the calibration circuitry 610, which results in the estimated timing skew error $\tau_{est}[p]$ being updated correctly.

FIG. 8 is a flow diagram of an example of a method 800 to determine and correct for timing skew errors in a two-way time-interleaved A/D conversion. The analog signal is converted to a sequence of digital values using a time-interleaved ADC. The method 800 can be performed using the circuitry of FIGS. 6 and 7. At block 805, the analog signal is converted to the sequence of digital values by time-interleaving A/D conversions of multiple ADCs according to multiple clock signals applied to the ADCs. The sampling clock signals having a defined phase relationship between them.

At block 810, the magnitude of timing skew error in the clock signals of the ADCs is determined. The timing skew error can be between any two clock signals applied to the ADCs.

At block 815, a dither sequence is applied to the phase of a first clock signal of the two clock signals having the timing skew error. The first clock signal is applied to a first ADC of the multiple ADCs and the second of the two clock signals is applied to another ADC. At block 820, the polarity of the gain experienced by the dither sequence at the output of the circuitry is determined. The polarity of the gain is the polarity of the timing skew error measurement. At block 825, the second clock signal is adjusted using a calibration loop. The determined magnitude and polarity of the timing skew error measurement is used to reduce the timing skew error.

The time-interleaved ADCs described herein operate with reduced timing skew error between the clock signals of the ADCs in the presence of input signals that may span multiple unknown Nyquist zones. The reduced timing skew error improves matching between slices of the interleaved ADC and reduces errors associated with interleaving A/D conversion.

ADDITIONAL DESCRIPTION AND EXAMPLES

A first Example (Example 1) includes subject matter (such as an electronic circuit) comprising multiple analog-to-digital converters (ADCs); clock circuitry configured to provide clock signals to the multiple ADCs to advance the multiple ADCs through time-interleaved analog-to-digital (A/D) conversions; and calibration circuitry. The calibration circuitry is configured to: determine a magnitude of timing skew error between any two of the clock signals; apply a dither sequence to a first clock signal of the any two clock signals, wherein the first clock signal is applied to a first ADC of the multiple ADCs; and determine a polarity of the timing skew error by determining a polarity of gain experienced by the dither sequence from the time-interleaved A/D conversions.

In Example 2, the subject matter of Example 1 optionally includes calibration circuitry configured to adjust a phase relation of the first clock signal and a second clock signal of the two clock signals according to the determined magnitude and polarity of the timing skew error.

In Example 3, the subject matter of one or both of Examples 1 and 2 optionally includes calibration circuitry configured to determine a first measure of similarity of an A/D conversion by the first ADC to a preceding A/D conversion by another ADC, determine a second measure of similarity of the A/D conversion of the first ADC to a following A/D conversion by the other ADC, compute a difference between the first measure of similarity and the second measure of similarity as the magnitude of the timing skew error, and adjust the phase of the first clock signal relative to a phase of another clock signal to minimize the difference between the first measure of similarity and the second measure of similarity.

In Example 4, the subject matter of Example 3 optionally includes calibration circuitry configured to determine multiple first products of A/D conversions of the first ADC and A/D conversions of the other ADC preceding the A/D conversions of the first ADC, determine multiple second products of the A/D conversions of the first ADC and A/D conversions of the other ADC following the A/D conversions of the first ADC, and average the multiple first products to determine the first measure of similarity and average the multiple second products to determine the second measure of similarity.

In Example 5, the subject matter of one or any combination of Examples 1-4 optionally includes calibration circuitry configured to apply the dither sequence to the calibration circuitry to change a phase of the first clock signal according to the dither sequence.

In Example 6, the subject matter of Example 5 optionally includes calibration circuitry configured to extract the gain experienced by the dither sequence by correlating a difference between pairs of A/D conversions to the dither sequence.

In Example 7, the subject matter of one or both of Examples 5 and 6 optionally includes calibration circuitry configured to determine a first product of an A/D conversion of the first ADC at a first sample time and an A/D conversion of the other ADC at a sample time previous to the first sample time, determining a second product of an A/D conversion of the first ADC at a first sample time and the A/D conversion of the other ADC at a sample time following the first sample time, and determine the polarity of the gain experienced by the dither sequence by correlating a value of the dither sequence to a difference of the first product and the second product.

In Example 8, the subject matter of one or any combination of Examples 1-7 optionally includes calibration circuitry configured to adjust a phase of the first clock signal by the determined magnitude of timing skew error relative to a phase of another clock signal according to the determined polarity of the gain experienced by the dither sequence.

In Example 9, the subject matter of one or any combination of Examples 1-8 optionally includes multiple ADCs produce time-interleaved A/D conversions of an input analog signal having signal components in multiple Nyquist zones.

Example 10 includes subject matter (such as a method of processing an analog signal) or can optionally be combined with one or any combination of Examples 1-9 to include such subject matter, comprising time-interleaving analog-to-digital (A/D) conversions of the analog signal using multiple analog-to-digital converters (ADCs) according to multiple clock signals applied to the multiple ADCs, determining a magnitude of a timing skew error between any two of the multiple clock signals, applying a dither sequence to phase of a first clock signal of the two clock signals, wherein the first clock signal is applied to a first ADC of the multiple ADCs, and determining a polarity of the timing skew error by determining a polarity of gain experienced by the dither sequence by the time-interleaved A/D conversions.

In Example 11, the subject matter of Example 10 optionally includes adjusting a phase of the first clock signal relative to a phase of a second clock signal of the two clock signals according to the determined magnitude and polarity of the timing skew error.

In Example 12, the subject matter of one or both of Examples 10 and 11 optionally includes determining a first measure of similarity of a time-interleaved A/D conversion of the first ADC to a previous time-interleaved A/D conversion of another ADC, determining a second measure of similarity of the time-interleaved A/D conversion of the first ADC to a following time-interleaved A/D conversion of the other ADC, computing a difference between the first measure of similarity and the second measure of similarity, and adjusting a phase of the first clock signal relative to a phase of another clock signal to minimize the difference between the first measure of similarity and the second measure of similarity.

In Example 13, the subject matter of Example 12 optionally includes determining multiple first products of A/D conversions of the first ADC and A/D conversions of the other ADC preceding the A/D conversions of the first ADC, averaging the multiple first products to determine the first measure of similarity, determining multiple second products of the A/D conversions of the first ADC and A/D conversions of the other ADC following the A/D conversions of the first ADC, and averaging the multiple second products to determine the second measure of similarity.

In Example 14, the subject matter of one or any combination of Examples 10-13 optionally includes time-interleaving of A/D conversions of an input analog signal having signal components in multiple Nyquist zones.

In Example 15, the subject matter of one or any combination of Examples 10-14 optionally includes changing the phase of the first clock signal according to the dither sequence.

In Example 16, the subject matter of Example 15 optionally includes correlating the dither sequence with differences between adjacent pairs of interleaved A/D conversions.

In Example 17, the subject matter of one or both of Examples 15 and 16 optionally includes determining a first product of an A/D conversion of the other ADC at a first sample time and an A/D conversion of the first ADC at a previous sample time previous to the first sample time, determining a second product of an A/D conversion of the first ADC at the previous sample time and the A/D conversion of the other ADC at the previous sample time, and correlating a value of the dither sequence at the previous sample time to a difference of the first product and the second product.

In Example 18, the subject matter of one or any combination of Examples 10-17 optionally includes adjusting a phase of the first clock signal by the determined magnitude of timing skew error relative to a phase of another clock signal according to the determined polarity of the gain experienced by the dither sequence.

Example 19 includes subject matter (such as a time-interleaved analog-to-digital converter (ADC) circuit) or can optionally be combined with one or any combination of Examples 1-18 to include such subject matter, comprising a first sub-ADC, a second sub-ADC, clock circuitry configured to provide a first clock signal to the first sub-ADC and a second clock signal to a second sub-ADC to advance the first and second sub-ADCs through time-interleaved analog-to-digital (A/D) conversions, and calibration circuitry. The calibration circuitry is configured to apply a specified dither sequence to a clock phase of the second clock signal, extract a gain experienced by the dither sequence from the time interleaved A/D conversions, and adjust a phase relation of the first clock signal and the second clock signal according to a polarity of the extracted gain according to a polarity of the extracted gain.

In Example 20, the subject matter of Example 19 optionally includes calibration circuitry configured to determine a first measure of similarity of an A/D conversion by the second sub-ADC to a preceding A/D conversion by the first sub-ADC, determine a second measure of similarity of the A/D conversion of the second sub-ADC to a following A/D conversion by the first sub-ADC, compute a difference between the first measure of similarity and the second measure of similarity, and adjust the phase of the second clock signal according to the polarity of the extracted gain to minimize the difference between the first measure of similarity and the second measure of similarity.

These nonlimiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
   multiple analog-to-digital converters (ADCs);
   clock circuitry configured to provide clock signals to the multiple ADCs to advance the multiple ADCs through time-interleaved analog-to-digital (A/D) conversions; and
   calibration circuitry configured to:
   determine a magnitude of timing skew error between any two of the clock signals;

9 apply a dither sequence to a first clock signal of any two clock signals, wherein the first clock signal is applied to a first ADC of the multiple ADCs and the dither sequence changes the timing skew error between the first clock signal and the other clock signal; and determine a polarity of the timing skew error by determining a polarity of gain experienced by the dither sequence from the time-interleaved A/D conversions.

2. The electronic circuit of claim 1, wherein the calibration circuitry is configured to adjust a phase relation of the first clock signal and a second clock signal of the two clock signals according to the determined magnitude and polarity of the timing skew error.

3. The electronic circuit of claim 1, wherein the calibration circuitry is configured to:

determine a first measure of similarity of an A/D conversion by the first ADC to a preceding A/D conversion by another ADC;

determine a second measure of similarity of the A/D conversion of the first ADC to a following A/D conversion by the other ADC;

compute a difference between the first measure of similarity and the second measure of similarity as the magnitude of the timing skew error; and adjust the phase of the first clock signal relative to a phase of another clock signal to minimize the difference between the first measure of similarity and the second measure of similarity.

4. The electronic circuit of claim 3, wherein the calibration circuitry is configured to:

determine multiple first products of A/D conversions of the first ADC and A/D conversions of the other ADC preceding the A/D conversions of the first ADC;

determine multiple second products of the A/D conversions of the first ADC and A/D conversions of the other ADC following the A/D conversions of the first ADC; and average the multiple first products to determine the first measure of similarity and average the multiple second products to determine the second measure of similarity.

5. The electronic circuit of claim 1, wherein the calibration circuitry is configured to apply the dither sequence to the calibration circuitry to change a phase of the first clock signal according to the dither sequence.

6. The electronic circuit of claim 5, wherein the calibration circuitry is configured to extract the gain experienced by the dither sequence by correlating a difference between pairs of A/D conversions to the dither sequence.

7. The electronic circuit of claim 5, wherein the calibration circuitry is configured to:

determine a first product of an A/D conversion of the first ADC at a first sample time and an A/D conversion of the other ADC at a sample time previous to the first sample time;

determining a second product of an A/D conversion of the first ADC at a first sample time and the A/D conversion of the other ADC at a sample time following the first sample time; and determine the polarity of the gain experienced by the dither sequence by correlating a value of the dither sequence to a difference of the first product and the second product.

8. The electronic circuit of claim 1, wherein the calibration circuitry is configured to adjust a phase of the first clock signal by the determined magnitude of timing skew error relative to a phase of another clock signal according to the determined polarity of the gain experienced by the dither sequence.

9. The electronic circuit of claim 1, wherein the multiple ADCs produce time-interleaved A/D conversions of an input analog signal having signal components in multiple Nyquist zones.

10. A method of processing an analog signal, the method comprising:

time-interleaving analog-to-digital (A/D) conversions of the analog signal using multiple analog-to-digital converters (ADCs) according to multiple clock signals applied to the multiple ADCs;

determining a magnitude of a timing skew error between any two of the multiple clock signals;

applying a dither sequence to phase of a first clock signal of the two clock signals, wherein the first clock signal is applied to a first ADC of the multiple ADCs and the dither sequence changes the timing skew error between the first clock signal and the other clock signal; and determining a polarity of the timing skew error by determining a polarity of gain experienced by the dither sequence by the time-interleaved A/D conversions.

11. The method of claim 10, including adjusting a phase of the first clock signal relative to a phase of a second clock signal of the two clock signals according to the determined magnitude and polarity of the timing skew error.

12. The method of claim 10, wherein the determining the magnitude of the timing skew error includes:

determining a first measure of similarity of a time-interleaved A/D conversion of the first ADC to a previous time-interleaved A/D conversion of another ADC;

determining a second measure of similarity of the time-interleaved A/D conversion of the first ADC to a following time-interleaved A/D conversion of the other ADC; and computing a difference between the first measure of similarity and the second measure of similarity; and adjusting a phase of the first clock signal relative to a phase of another clock signal to minimize the difference between the first measure of similarity and the second measure of similarity.

13. The method of claim 12, wherein the determining the first measure of similarity includes:

determining multiple first products of A/D conversions of the first ADC and A/D conversions of the other ADC preceding the A/D conversions of the first ADC; and averaging the multiple first products to determine the first measure of similarity;

wherein the determining the second measure of similarity includes:

determining multiple second products of the A/D conversions of the first ADC and A/D conversions of the other ADC following the A/D conversions of the first ADC; and averaging the multiple second products to determine the second measure of similarity.

14. The method of claim 10, wherein the time-interleaving of A/D conversions of the analog signal includes time-interleaving of A/D conversions of an input analog signal having signal components in multiple Nyquist zones.

15. The method of claim 10, wherein the applying the dither sequence to the first clock signal includes changing the phase of the first clock signal according to the dither sequence.

16. The method of claim 15, wherein the determining the polarity of the gain experienced by the dither sequence includes correlating the dither sequence with differences between adjacent pairs of interleaved A/D conversions.

17. The method of claim 15, wherein the determining the polarity of the gain experienced by the dither sequence includes:

determining a first product of an A/D conversion of the first ADC at a first sample time and an A/D conversion of the other ADC at a sample time previous to the first sample time;

determining a second product of an A/D conversion of the first ADC at a first sample time and the A/D conversion of the other ADC at a sample time following the first sample time; and correlating a value of the dither sequence at the previous sample time to a difference of the first product and the second product.

18. The method of claim 10, including adjusting a phase of the first clock signal by the determined magnitude of timing skew error relative to a phase of another clock signal according to the determined polarity of the gain experienced by the dither sequence.

19. A time-interleaved analog-to-digital converter (ADC) circuit, the ADC circuit comprising:

a first sub-ADC;

a second sub-ADC;

clock circuitry configured to provide a first clock signal to the first sub-ADC and a second clock signal to a second sub-ADC to advance the first and second sub-ADCs through time-interleaved analog-to-digital (A/D) conversions; and calibration circuitry configured to:

apply a specified dither sequence to a clock phase of the second clock signal, wherein the dither sequence changes a timing skew error between the first clock signal and the second clock signal;

extract a gain experienced by the dither sequence from the time interleaved A/D conversions; and adjust a phase relation of the first clock signal and the second clock signal according to a polarity of the extracted gain according to a polarity of the extracted gain.

20. The ADC circuit of claim 19, wherein the calibration circuitry is configured to:

determine a first measure of similarity of an A/D conversion by the second sub-ADC to a preceding A/D conversion by the first sub-ADC;

determine a second measure of similarity of the A/D conversion of the second sub-ADC to a following A/D conversion by the first sub-ADC;

compute a difference between the first measure of similarity and the second measure of similarity; and adjust the phase of the second clock signal according to the polarity of the extracted gain to minimize the difference between the first measure of similarity and the second measure of similarity.

* * * * *